(12) United States Patent
Lee et al.

(10) Patent No.: US 11,250,775 B2
(45) Date of Patent: Feb. 15, 2022

(54) DISPLAY DEVICE

(71) Applicant: Samsung Display Co., Ltd., Yongin-Si (KR)

(72) Inventors: Ju Hee Lee, Yongin-si (KR); Dae Youn Cho, Yongin-si (KR); Jong Woo Park, Yongin-si (KR); Young Tae Choi, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/374,675

(22) Filed: Apr. 3, 2019

(65) Prior Publication Data
US 2019/0318690 A1    Oct. 17, 2019

(30) Foreign Application Priority Data
Apr. 16, 2018    (KR) ........................ 10-2018-0044102

(51) Int. Cl.
*G09G 3/3233* (2016.01)
*G09G 3/3291* (2016.01)
*G09G 3/3266* (2016.01)
*H01L 27/32* (2006.01)

(52) U.S. Cl.
CPC ......... *G09G 3/3233* (2013.01); *G09G 3/3266* (2013.01); *G09G 3/3291* (2013.01); *H01L 27/3276* (2013.01); *G09G 2300/0413* (2013.01); *G09G 2300/0426* (2013.01); *G09G 2300/0439* (2013.01); *G09G 2300/0809* (2013.01); *G09G 2310/08* (2013.01)

(58) Field of Classification Search
None
See application file for complete search history.

(56) References Cited

U.S. PATENT DOCUMENTS

| 8,786,814 B2 | 7/2014 | Kim et al. |
| 9,585,252 B2 | 2/2017 | Yeo et al. |
| 2014/0175977 A1* | 6/2014 | Yoon .................... G09G 3/3208 315/51 |
| 2017/0077143 A1* | 3/2017 | Lee ....................... G09G 3/3648 |

FOREIGN PATENT DOCUMENTS

KR    10-2016-0029958 A    3/2016

* cited by examiner

*Primary Examiner* — Andre L Matthews
(74) *Attorney, Agent, or Firm* — Innovation Counsel LLP

(57) ABSTRACT

A display device includes a pixel, a first control pad, a second control pad, and a first dummy pad. The pixel may emit light with luminance corresponding to a data signal. Supply of the data signal to the pixel depends on a first control signal and a second control signal. The first control pad is connected to a first control line for supplying the first control signal. The second control pad is connected to a second control line for supplying the second control signal. The first dummy pad is positioned between the first control pad and the second control pad and may receive a first dummy signal. A voltage level of the first dummy signal is in a range from a voltage level of the first control signal to a voltage level of the second control signal.

8 Claims, 15 Drawing Sheets

FIG. 8
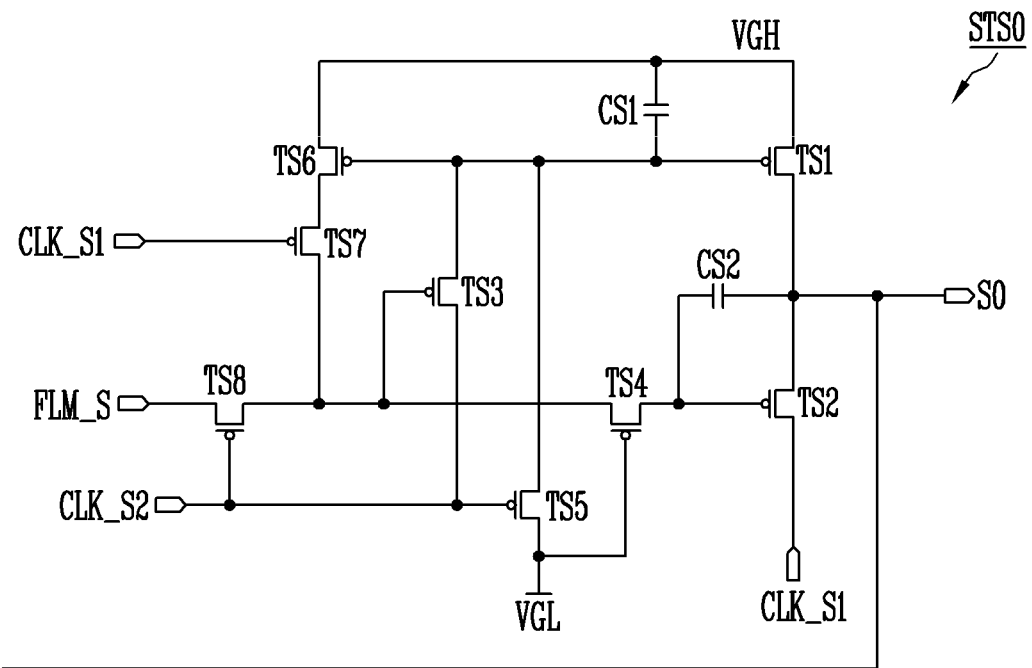
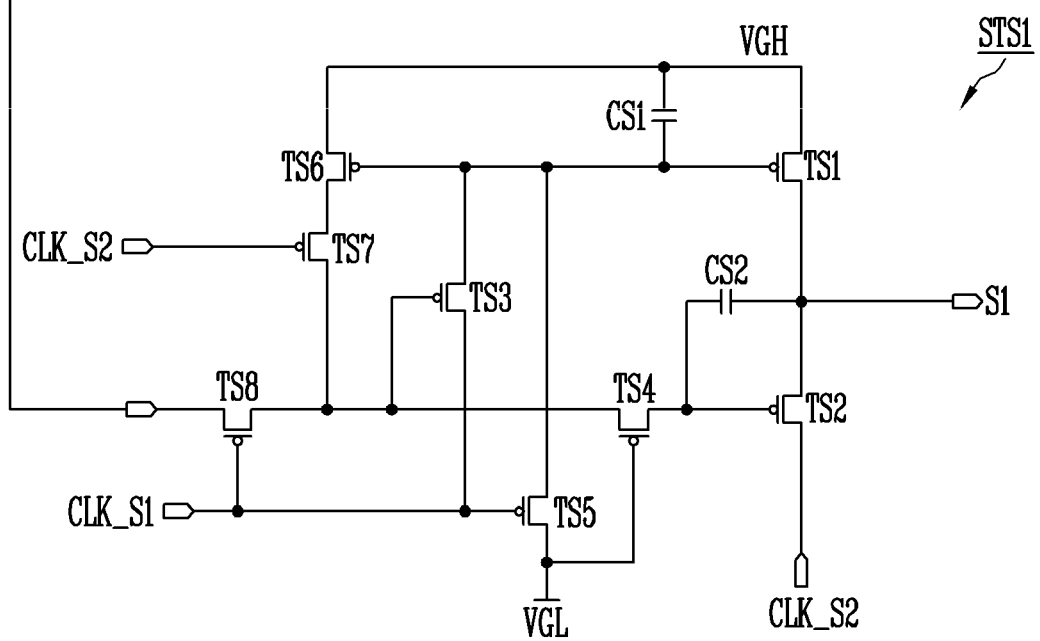

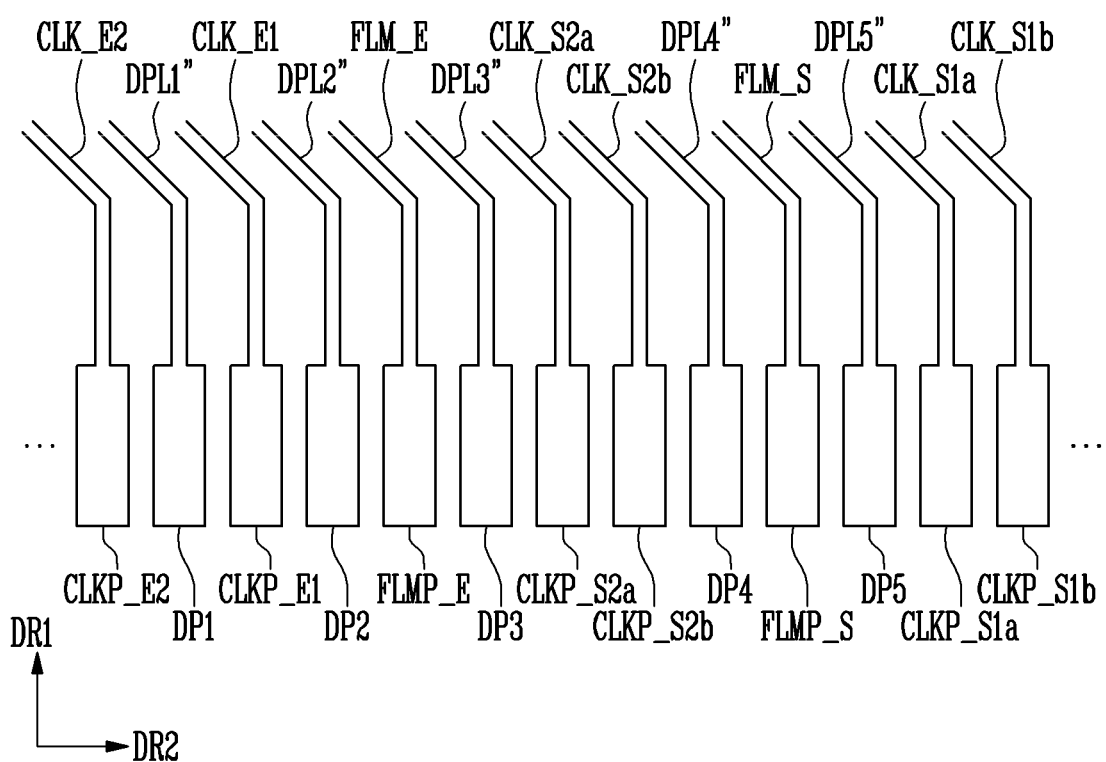

DISPLAY DEVICE

CROSS-REFERENCE TO RELATED APPLICATION

This application claims priority to and the benefit of Korean Patent Application No. 10-2018-0044102 filed in the Korean Intellectual Property Office on Apr. 16, 2018; the entire contents of the Korean Patent Application are incorporated herein by reference.

BACKGROUND (a) Field

The technical field relates to a display device.

(b) Description of the Related Art

A display device may be, for example, a liquid crystal display device, an organic light emitting display device, or a plasma display device.

In order to drive/control a display device, various signals are required. These various signals may be inputted to components of the display device through densely packed pads in the display device. Electromagnetic interference may occur between signals inputted through adjacent pads.

The above information disclosed in this Background section is for enhancement of understanding of the background of this application. The Background section may contain information that does not form prior art.

SUMMARY

Embodiments may be related to a display device with minimum electromagnetic interference between signals that are inputted to adjacent pads. Embodiments may be related to a method for operating the display device. Embodiments may prevent adjacent pads from being short-circuited.

An embodiment may be related to a display device that includes the following elements: a pixel for emitting light with luminance corresponding to a data signal depending on a first control signal and a second control signal; a first control pad connected to a first control line supplying the first control signal; a second control pad connected to a second control line supplying the second control signal; and a first dummy pad that is positioned between the first control pad and the second control pad. The first dummy pad may receive a first dummy signal. A voltage level of the first dummy signal may be in a range of a voltage level of the first control signal to a voltage level of the second control signal.

The voltage level of the first dummy signal may be an average voltage level of the first control signal and the second control signal.

The voltage level of the first dummy signal may be changed when a voltage level of at least one of the first control signal and the second control signal is changed.

The display device may further include a second dummy pad that is positioned between the first dummy pad and the second control pad, and to which a second dummy signal having a voltage level corresponding to one of a voltage level between the first control signal and the second control signal, a voltage level of the first control signal, and a voltage level of the second control signal is applied.

When the first control signal and the second control signal have the same voltage level, the first dummy signal and the second dummy signal may have the same voltage level.

When the voltage level of the first control signal is greater than that of the second control signal, the voltage level of the first dummy signal may be greater than that of the second dummy signal.

When the voltage level of the second control signal is greater than that of the first control signal, the voltage level of the second dummy signal may be greater than that of the first dummy signal.

The display device may further include a first dummy line connected to the first dummy pad and positioned between the first control line and the second control line.

The display device may further include a display area in which the pixel is positioned; a non-display area surrounding the display area; a pad area in which the first control pad, the second control pad, and the first dummy pad are positioned; and a wire area that is positioned between the non-display area and the pad area, wherein the first control line and the second control line may be positioned in the pad area, the wire area, and the non-display area, and the first dummy line may be positioned in the pad area and the wire area.

The display device may further include a scan driver supplying a scanning signal that determines whether to input the data signal to the pixel, wherein the first control line may be connected to the scan driver.

The second control line may be connected to the scan driver.

The display device may further include a light emission control driver supplying a light emission control signal that determines light emitting starting and finishing points of the pixel, wherein the second control line may be connected to the light emission control driver.

An embodiment may be related to a display device that includes the following elements: a display area in which a pixel is positioned; a non-display area surrounding the display area; a pad area in which a first control pad, a second control pad, and a first dummy pad are positioned; and a wire area positioned between the non-display area and the pad area, wherein a first control line extending from the first control pad and a second control line extending from the second control pad may be positioned in the pad area, the wire area, and the non-display area, and a first dummy line extending the first dummy pad and positioned between the first control line and the second control line may be positioned in the pad area and the wire area.

The display device may further include a scan driver positioned in the non-display area and connected to the pixel through a scanning line, wherein the first control line may be connected to the scan driver.

The second control line may be connected to the scan driver.

The display device may further include a light emission control driver positioned in the non-display area and connected to the pixel through a light emission control line, wherein the second control line may be connected to the light emission control driver.

The display device may further include a second dummy pad positioned between the first dummy pad and the second control pad.

The display device may further include a second dummy line extending from the second dummy pad.

An embodiment may be related to a method of operating a display device. The method may include providing a first control signal and a second control signal for controlling supply of a data signal to a pixel of the display device. The pixel may emit light with luminance corresponding to the data signal. The first control signal is provided to a first control pad of the display device and transmitted through a first control line of the display device. The second control signal is provided to a second control pad of the display device and transmitted through a second control line of the display device. The method may further include providing a first dummy signal to a first dummy pad. The first dummy pad is positioned between the first control pad and the second control pad. A voltage level of the first dummy signal may be in a range from a voltage level the first control signal to a voltage level of the second control signal.

The voltage level of the first dummy signal may be an average of the voltage level of the first control signal and the voltage level of the second control signal.

Embodiments may reduce electromagnetic interference between signals that are inputted to adjacent pads and/or may prevent adjacent pads from being short-circuited.

BRIEF DESCRIPTION OF THE DRAWINGS

FIG. 8 illustrates a schematic diagram (e.g., a circuit diagram) for explaining a first scan driver according to an embodiment.

FIG. 17 illustrates a schematic diagram (e.g., a plan view) for explaining pads according to the embodiment of FIG. 16.

DETAILED DESCRIPTION OF EMBODIMENTS

Figure 1:
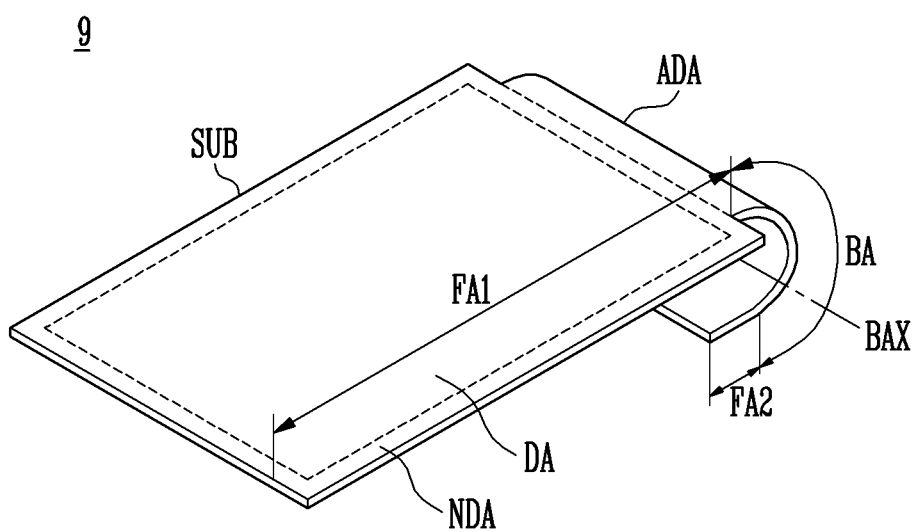
FIG. 1 and FIG. 2 illustrate schematic diagrams (e.g., a perspective view and a plan view) for explaining a display device according to an embodiment.

Example embodiments are described with reference to the accompanying drawings. As those skilled in the art would realize, the described embodiments may be modified in various ways.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. The term "connect" may mean electrically connect.

In the drawings, thicknesses of layers, films, panels, regions, etc. may be exaggerated for clarity.

Figure 2:
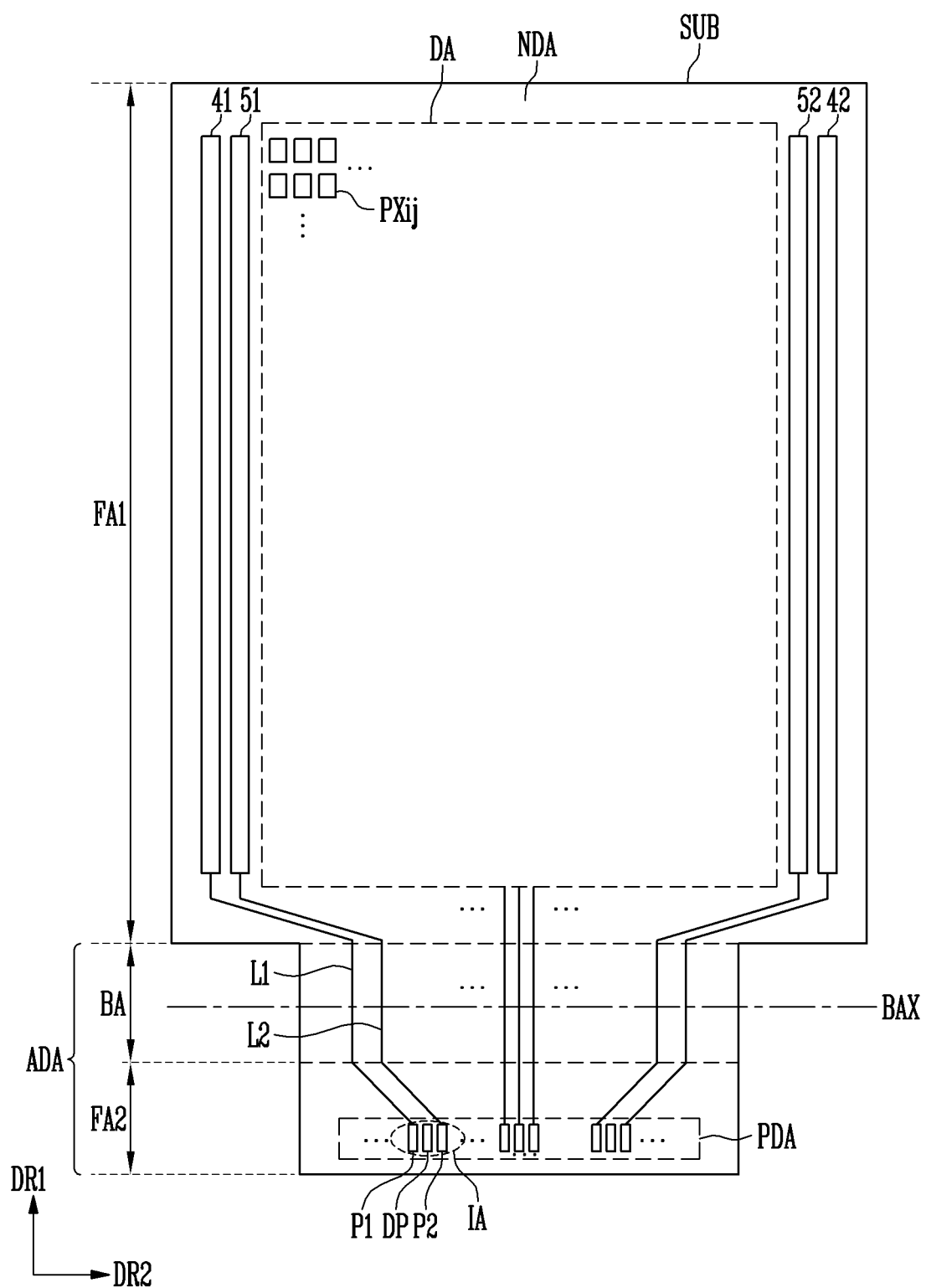

FIG. 1 and FIG. 2 illustrate schematic diagrams for explaining a display device according to an embodiment.

Referring to FIG. 1 and FIG. 2, a display device 9 according to an embodiment may include a display area DA, a non-display area NDA, and an additional area ADA. Specifically, a substrate SUB of the display device 9 may include the aforementioned areas.

A pixel PXij may be positioned in the display area DA. The pixel PXij may emit light at a luminance corresponding to a data signal. Supply of the data signal to the pixel PXij may depend on a first control signal and a second control signal. In some embodiments, the first control signal and the second control signal may not be directly applied to the pixel PXij. For example, other signal generated in response to the first control signal and the second control signal may be applied to the pixel PXij.

The non-display area NDA may be an area surrounding the display area DA. A first scan driver 41 and a first light emission control driver 51 may be positioned in the non-display area NDA. In some embodiments, a second scan driver 42 and a second light emission control driver 52 may be further positioned in the non-display area NDA.

In FIG. 2, the second scan driver 42 and the second light emission control driver 52 are positioned in a second direction DR2 from the display area DA, and the first scan driver 41 and the first light emission control driver 51 is positioned in an opposite direction of the second direction DR2 from the display area DA. The positions of the first scan driver 41, the positions of the first light emission control driver 51, the second scan driver 42, and the second light emission control driver 52 may be configured according to particular embodiments.

When the pixel PXij is formed, the first scan driver 41, the first light emission control driver 51, the second scan driver 42, and the second light emission control driver 52 may be formed together with the pixel PXij and be mounted on the substrate SUB. In some embodiments, the first scan driver 41, the first light emission control driver 51, the second scan driver 42, and the second light emission control driver 52 may be formed on a separate chip to be provided on the substrate SUB in a form of a chip-on-glass, a chip-on-plastic, and/or a chip-on-film.

The additional area ADA may be an area protruding from the non-display area NDA. The additional area ADA may include a pad area PDA.

Pads may be positioned in the pad area PDA. The pads may include a first control pad PA, a second control pad P2, and a first dummy pad DP. The first dummy pad DP may be positioned between the first control pad PA and the second control pad P2. All or some of pads may be connected to a driver-IC. The driver-IC may be provided in a form of a chip-on-glass, a chip-on-plastic, or a chip-on-film to be connected to the pads. In embodiments, the driver-IC and the pads may be connected using an anisotropic conductive film.

An area between the non-display area NDA and the pad area PDA may be defined as a wire area. A plurality of wires may be positioned in the wire area. In embodiments, the plurality of wires may include a first control line L1 extending from a first control pad P1 and a second control line L2 extending from the second control pad P2.

The substrate SUB may be made of various materials such as glass, polymer, and/or metal. The substrate SUB may be one of a rigid substrate and a flexible substrate depending on a product to which the substrate SUB is applied. When the substrate SUB is configured to include a polymer organic material, the substrate SUB may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. The substrate SUB may be made of a fiber glass reinforced plastic (FRP).

FIG. 1 and FIG. 2 illustrate a case in which the substrate SUB is flexible. In embodiments, when the display device 9 is mounted on a module, the additional area ADA may include a bending area BA and a flat area FA2 in order to increase spatial utilization. In embodiments, the flat area FA2 may include the pad area PDA, and only wires may be positioned in the bending area BA. In embodiments, when the substrate SUB is not bent, wires (L1, L2, . . . ) may extend in a first direction DR1 which is a direction substantially perpendicular to a bending axis BAX in the bending area BA. Accordingly, it is possible to prevent the wires (L1, L2, . . . ) from being cut even when stress is generated in the bending area BA. In the embodiment, the display area DA and the non-display area NDA may correspond to a flat area FA1. Accordingly, when the substrate SUB is bent with respect to the bending axis BAX, a stress applied to the display area DA, the non-display area NDA, and the pad area PDA may be neglected compared with that applied to the bending area BA. Therefore, it is possible to prevent electric elements positioned in respective areas DA, NDA, and PDA from being broken.

Figure 3:
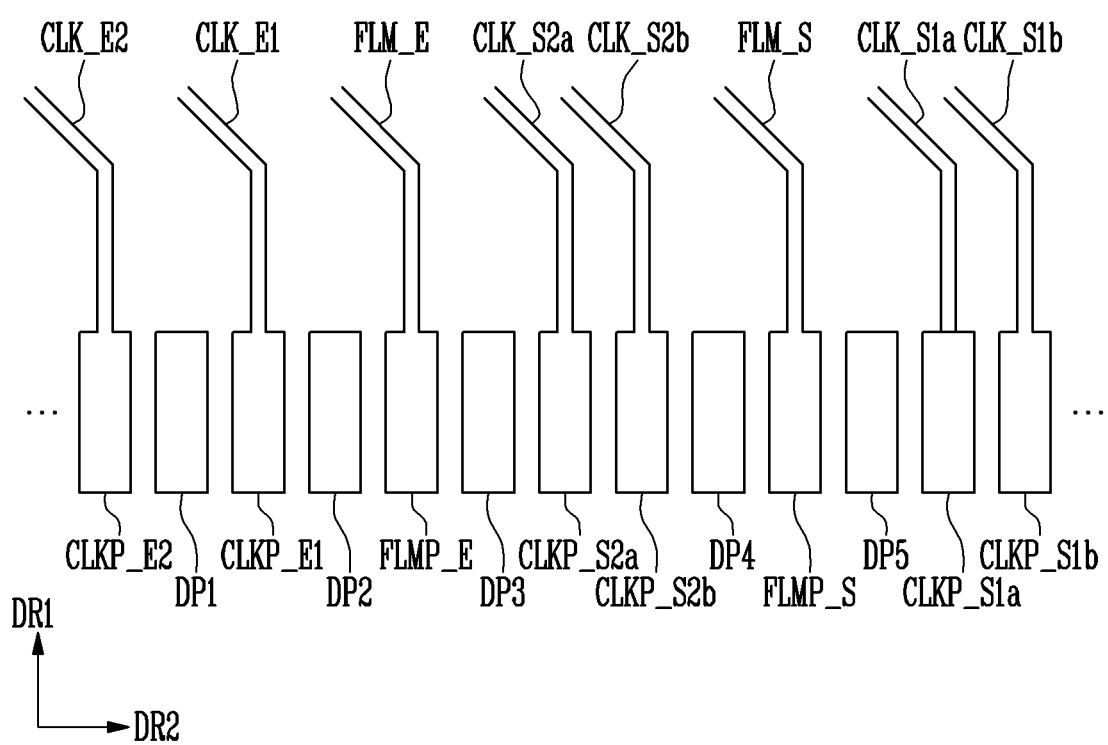
FIG. 3 illustrates a schematic diagram (e.g., a plan view) for explaining pads according to an embodiment.

FIG. 3 illustrates a schematic diagram for explaining pads according to an embodiment.

FIG. 3 is an enlarged view of an area IA of FIG. 2. Control pads CLKP_E2, CLKP_E1, FLMP_E, CLKP_S2a, CLKP_S2b, FLMP_S, CLKP_S1a, and CLKP_S1b, which are connected to control lines CLK_E2, CLK_E1, FLM_E, CLK_S2a, CLK_S2b, FLM_S, CLK_S1a, and CLK_S1b, may be positioned in the area IA. Dummy pads DP1, DP2, DP3, DP4, and DP5 may also be positioned in the area IA.

The control line CLK_S2a and the control line CLK_S2b may be connected to the control line CLK_S2 (e.g., illustrated in FIG. 8). In addition, the control line CLK_S1a and the control line CLK_S1b may be connected to the control line CLK_S1 (see FIG. 8 and FIG. 9).

The control pad P1 and/or the control pad P2 illustrated in FIG. 2 may represent one or more of the control pads CLKP_E2, CLKP_E1, FLMP_E, CLKP_S2a, CLKP_S2b, FLMP_S, CLKP_S1a, and CLKP_S1b. The dummy pad DP illustrated in FIG. 2 may represent one or more of the dummy pads DP1, DP2, DP3, DP4, and DP5. The dummy pad DP1 may be positioned between the control pad CLKP_E2 and the control pad CLKP_E1. The dummy pad DP2 may be positioned between the control pad CLKP_E1 and the control pad FLMP_E. The dummy pad DP3 may be positioned between the control pad FLMP_E and the control pad CLKP_S2a. The dummy pad DP4 may be positioned between the control pad CLKP_S2b and the control pad FLMP_S. The dummy pad DP5 may be positioned between the control pad FLMP_S and the control pad CLKP_S1a.

Figure 4:
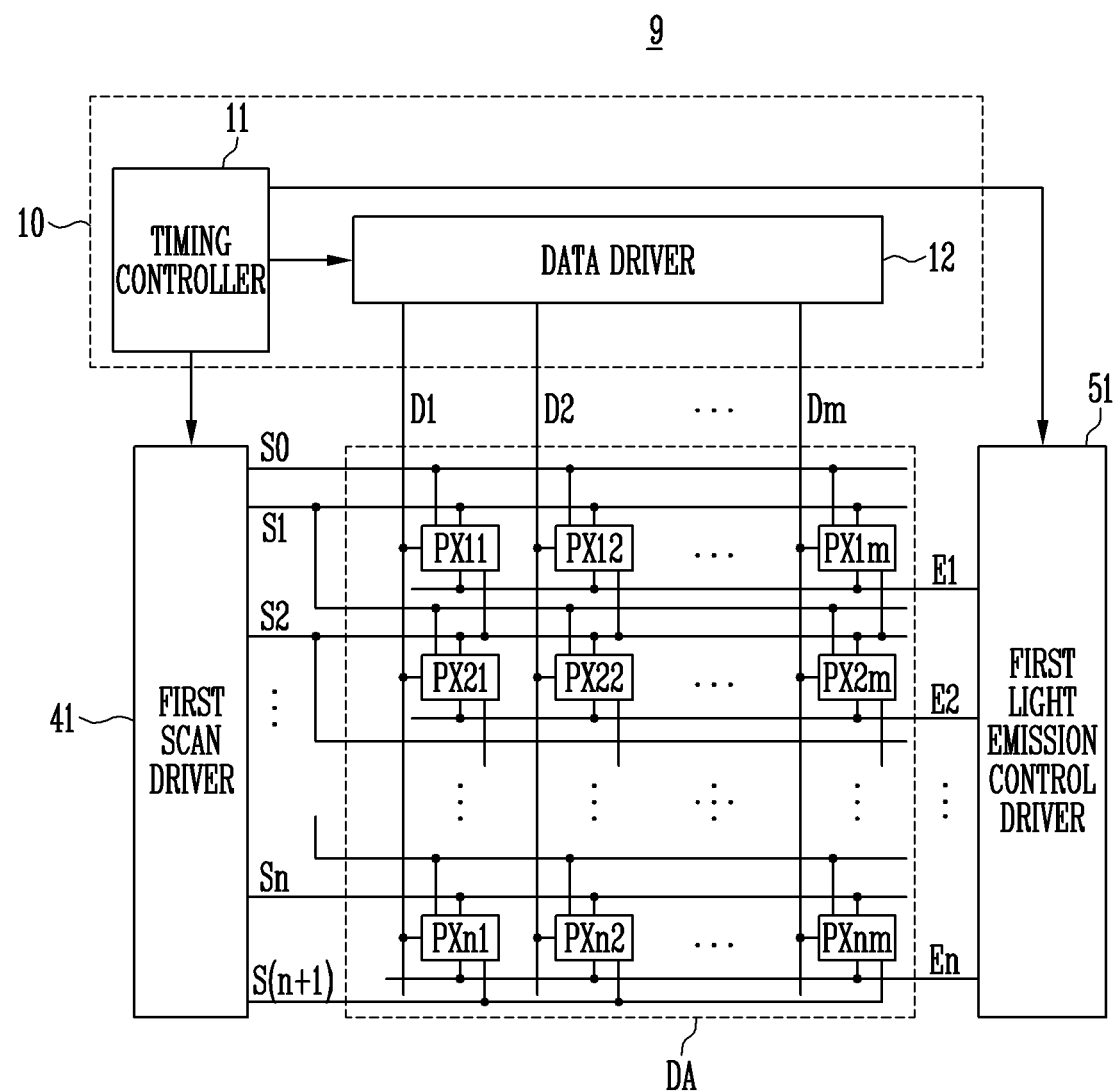
FIG. 4 illustrates a schematic diagram (e.g., a block diagram) for explaining an electrical structure of a display device according to an embodiment.

FIG. 4 illustrates a schematic diagram form explaining an electrical structure of a display device according to an embodiment.

Referring to FIG. 4, the display device 9 may include a driver-IC 10, the first scan driver 41, the first light emission control driver 51, and pixels PX11 to PXnm (including pixels PX11, PX12, PX1m, PX21, PX22, PX2m, PXn1, PXn2, and PXnm) positioned in the display area DA.

As shown in FIG. 2, in some embodiments, the display device 9 may further include the second scan driver 42 and the second light emission control driver 52. In embodiments, the second scan driver 42 performs the same/similar function as the first scan driver 41 and the second light emission control driver 52 performs the same/similar function as the first light emission control driver 51.

The driver-IC 10 may include a timing controller 11 and a data driver 12. In embodiments, when a plurality of data drivers is required, each of the plurality of driver ICs may include a data driver, and the timing controller may be separately provided to control the plurality of driver ICs. In embodiments, the timing controller 11 and the data driver 12 are present in one driver-IC 10.

The timing controller 11 may convert a control signal and a video signal supplied from a processor (for example, an application processor) to correspond to specifications of the display device 9, and it may supply a necessary control signal and video signal to the data driver 12, the first scan driver 41, and the first light emission control driver 51.

The data driver 12 may receive the control signal and the video signal from the timing controller 11 to generate data signals to be supplied to data lines D1 to Dm. The data signals generated in a pixel column unit may be simultaneously applied to the data lines D1, D2, to Dm.

The first scan driver 41 may receive the control signal from the timing controller 11 to generate scanning signals to be supplied to scanning lines S0, S1, S2 to Sn, S(n+1). Whether or not the data signal is inputted to the pixel may be determined by a voltage level of the scanning signal. In embodiments, the control signal received from the timing controller 11 may be at least one of the first control signal and the second control signal. The first scan driver 41 will be described in detail with reference to FIG. 8 and FIG. 9.

The first light emission control driver 51 may receive the control signal from the timing controller 11 to generate light emission control signals to be supplied to light emission control lines E1, E2, to En. A light emitting starting point and light emitting finishing point of the pixel may be determined by a voltage level of the light emission control signal. In embodiments, the control signal received from the timing controller 11 may be at least one of the first control signal and the second control signal. The first light emission control driver 51 is described with reference to FIG. 5 and FIG. 6.

The pixels PX11 to PXnm may be respectively connected to corresponding ones of the data lines D1 to Dm, the scanning lines S0 to S(n+1), and the light emission control lines E1 to En. The pixels PX11 to PXnm may be further connected to power source voltage lines ELVDD and ELVSS, and an initialization line VINT (see FIG. 11). Each of the pixels PX11 to PXnm may emit light with luminance corresponding to a data signal according to the first control signal and the second control signal. Specifically, at least one of the first scan driver 41 and the first light emission control driver 51 may be controlled by the first control signal and the second control signal, and it may emit light with luminance corresponding to the data signal according to the scanning signal and the light emission control signal generated from the first scan driver 41 and the first light emission control driver 51. A driving method of the pixel PXij is described with reference to FIG. 11 and FIG. 12.

Figure 5:
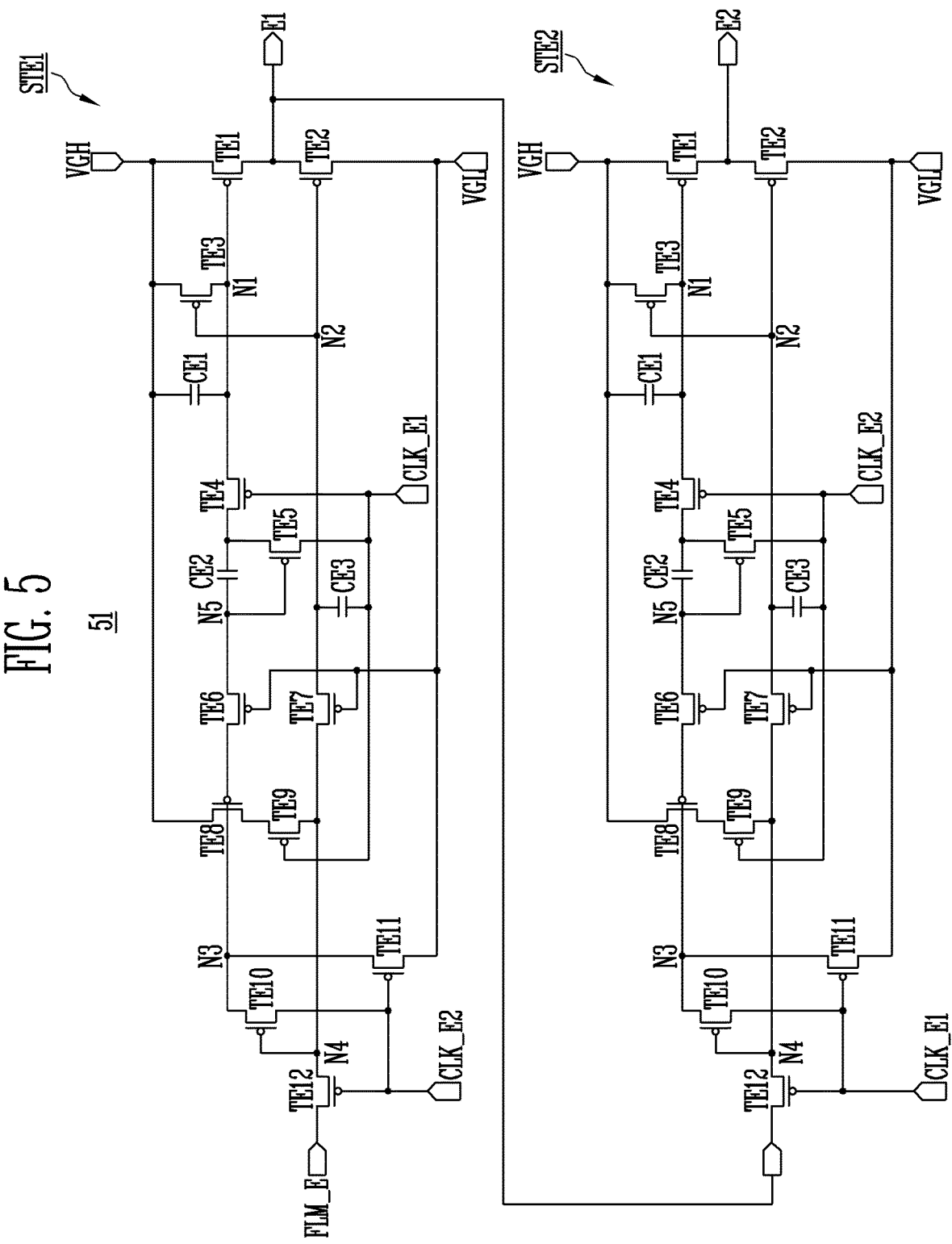
FIG. 5 illustrates a schematic diagram (e.g., a circuit diagram) for explaining a first light emission control driver according to an embodiment.

FIG. 5 illustrates a schematic diagram for explaining a first light emission control driver according to an embodiment.

Referring to FIG. 5, the first light emission control driver 51 according to the embodiment includes light emission control stages (STE1, STE2, . . . ).

The light emission control stages (STE1, STE2, . . . ) may be configured in a form of a shift register, which outputs a current light emission control signal of a current light emission control stage based on a previous light emission control signal outputted from a previous light emission control stage. However, since the first light emission control stage STE1 cannot receive a previous light emission control signal, it can be driven by receiving a light emission control start signal.

The light emission control stages (STE1, STE2, . . . ) may be connected to the first light emission control clock line CLK_E1, the second light emission control clock line CLK_E2, a high voltage line VGH, and a low voltage line VGL, respectively. The first light emission control clock line CLK_E1 and the second light emission control clock line CLK_E2 may be sequentially alternately connected to the light emission control stages (STE1, STE2, . . . ). A voltage applied to the high voltage line VGH may be higher than that applied to the low voltage line VGL. The light emission control stages (STE1, STE2, . . . ) may be selectively connected to light emission control lines (E1, E2, . . . ) corresponding to the high voltage line VGH or the low voltage line VGL.

Internal configurations of the light emission control stages (STE1, STE2, . . . ) are substantially the same.

The light emission control stage STE1 may include light emission control transistors TE1, TE2, TE3, TE4, TE5, TE6, TE7, TE8, TE9, TE10, TE11, and TE12, and capacitors CE1, CE2, and CE3.

Although all the transistors are described as a P-type hereinafter, a person of an ordinary skill in the art may use an N-type transistor as needed. A P-type transistor refers to a transistor in which an amount of current that is conducted when a voltage difference between a gate terminal and a source terminal increases in a negative direction increases. An N-type transistor refers to a transistor in which an amount of current that is conducted when a voltage difference between a gate terminal and a source terminal increases in a positive direction increases. The transistor may be configured in various forms such as a thin film transistor (TFT), a field effect transistor (FET), and a bipolar junction transistor (BJT).

One electrode of the first light emission control transistor TE1 may be connected to the high voltage line VGH, and the other electrode thereof may be connected to the light emission control line E1, and a gate electrode thereof may be connected to a first node N1.

One electrode of the second light emission control transistor TE2 may be connected to the light emission control line E1, the other electrode thereof may be connected to the low voltage line VGL, and a gate electrode thereof may be connected to a second node N2.

One electrode of the third light emission control transistor TE3 may be connected to the high voltage line VGH, the other electrode thereof may be connected to the first node N1, and a gate electrode thereof may be connected to the second node N2.

One electrode of the fourth light emission control transistor TE4 may be connected to the first node N1, the other electrode thereof may be connected to one electrode of the fifth light emission control transistor TE5, and a gate electrode thereof may be connected to the first light emission control clock line CLK_E1.

One electrode of the fifth light emission control transistor TE5 may be connected to the other electrode of the fourth light emission control transistor TE4, the other electrode thereof may be connected to the first light emission control clock line CLK_E1, and a gate electrode thereof may be connected to a fifth node N5.

One electrode of the sixth light emission control transistor TE6 may be connected to the fifth node N5, the other electrode thereof may be connected to a third node N3, and a gate electrode thereof may be connected to the low voltage line VGL.

One electrode of the seventh light emission control transistor TE7 may be connected to the second node N2, the other electrode thereof may be connected to a fourth node N4, and a gate electrode thereof may be connected to the low voltage line VGL.

One electrode of the eighth light emission control transistor TE8 may be connected to the high voltage line VGH, the other electrode thereof may be connected to one electrode of the ninth light emission control transistor TE9, and a gate electrode thereof may be connected to the fifth node N5.

One electrode of the ninth light emission control transistor TE9 may be connected to the other electrode of the eighth light emission control transistor TE8, the other electrode thereof may be connected to the fourth node N4, and a gate electrode thereof may be connected to the first light emission control clock line CLK_E1.

One electrode of the tenth light emission control transistor TE10 may be connected to the third node N3, the other electrode thereof may be connected to the second light emission control clock line CLK_E2, and a gate electrode thereof may be connected to the fourth node N4.

One electrode of the eleventh light emission control transistor TE11 may be connected to the third node N3, the other electrode thereof may be connected to the low voltage line VGL, and a gate electrode thereof may be connected to the second light emission control clock line CLK_E2.

One electrode of the twelfth light emission control transistor TE12 may be connected to the fourth node N4, the other electrode thereof may be connected to a light emission control start line FLM_E, and a gate electrode thereof may be connected to the second light emission control clock line CLK_E2.

One electrode of the capacitor CE1 may be connected to the high voltage line VGH, and the other electrode thereof may be connected to the first node N1.

One electrode of the capacitor CE2 may be connected to the fourth light emission control transistor TE4, and the other electrode thereof may be connected to the fifth node N5.

One electrode of the capacitor CE3 may be connected to the second node N2, and the other electrode thereof may be connected to the first light emission control clock line CLK_E1.

Figure 6:
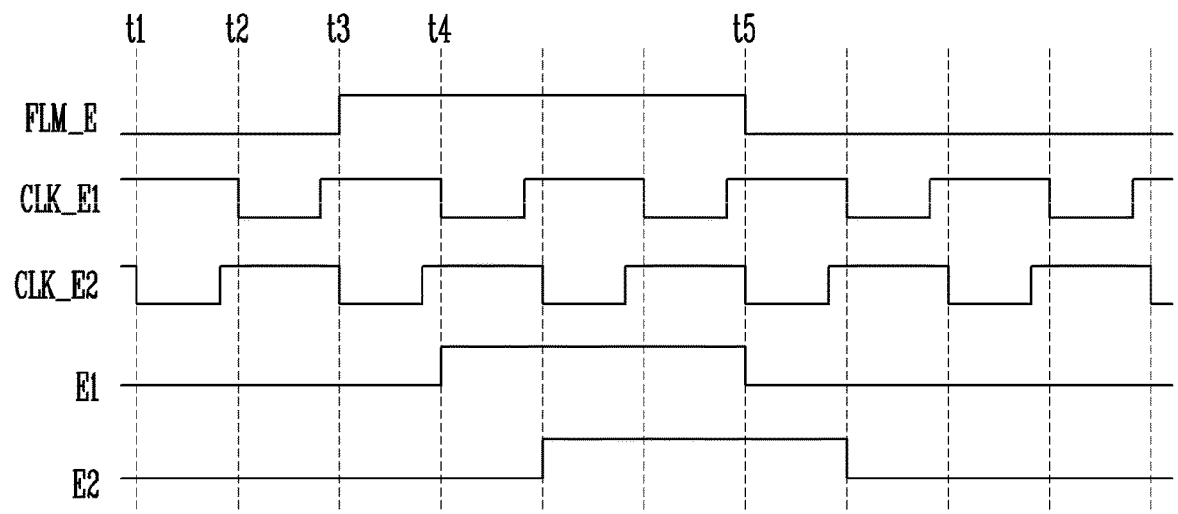
FIG. 6 illustrates a timing chart for explaining a driving method of a first light emission control driver according to an embodiment.

FIG. 6 illustrates a timing chart for explaining a driving method of a first light emission control driver.

A signal applied to the light emission control start line FLM_E is referred to as a light emission control start signal, a signal applied to the first light emission control clock line CLK_E1 is referred to as a first light emission control clock signal, a signal applied to the second light emission control clock line CLK_E2 is referred to as a second light emission control clock signal, a signal applied to the first light emission control line E1 is referred to as a first light emission control signal, and a signal applied to the second light emission control line E2 is referred to as a second light emission control signal. In FIG. 6, a voltage level of each signal is shown. In FIG. 6, the voltage level of each signal is described as one of a low level and a high level.

In FIG. 6, a horizontal interval between vertical dashed lines may mean one horizontal period.

At the time point t1, the second light emission control clock signal is changed to the low level, the light emission control start signal is maintained at the low level, and the first light emission control clock signal is maintained at the high level.

Accordingly, the light emission control transistors TE2, TE3, TE5, TE6, TE7, TE8, TE10, TE11, and TE12 are turned on, and the light emission control transistors TE1, TE4, and TE9 are turned off. The low voltage line VGL is connected to the first light emission control line E1 through the turned-on second light emission control transistor TE2. Accordingly, the first light emission control signal of the low level is applied to the first light emission control line E1.

Thereafter, when the second light emission control clock signal is changed to the high level, the tenth light emission control transistor TE10 is maintained in a turned-on state due to the capacitor CE3, and the second light emission control clock signal of the high level is applied to the third node N3 and the fifth node N5.

At the time point t2, the first light emission control clock signal is changed to the low level, the light emission control start signal is maintained at the low level, and the second light emission control clock signal is maintained at the high level.

Accordingly, the light emission control transistors TE2, TE3, TE4, TE6, TE7, TE9, and TE10 are turned on, and the light emission control transistors TE1, TE5, TE8, TE11, and TE12 are turned off.

In embodiments, the second node N2 is boosted to a level lower than the low level due to the capacitive coupling through the first light emission control clock line CLK_E1 and the capacitor CE3. Accordingly, driving characteristics of the light emission control transistors TE2 and TE3 are improved.

In embodiments, since the fourth node N4 is connected to the second node N2 through the seventh light emission control transistor TE7, the influence of boosting for the fourth node N4 may be restricted unlike the second node N2. Accordingly, since a voltage difference between one electrode of the twelfth light emission control transistor TE12 and another electrode thereof is minimized, it is possible to prevent the driving characteristics of the twelfth light emission control transistor TE12 from being changed.

At the time point t3, the light emission control start signal is changed to the high level, the second light emission control clock signal is changed to the low level, and the first light emission control clock signal is maintained at the high level.

Accordingly, the light emission control transistors TE5, TE6, TE7, TE8, TE11, and TE12 are turned on, and the light emission control transistors TE1, TE2, TE3, TE4, TE9, and TE10 are turned off.

Specifically, since the light emission control start signal of the high level is applied to the second node N2 through the turned-on twelfth light emission control transistor TE12, the second light emission control transistor TE2 is turned off. In addition, since the first node N1 is maintained at the high level by the capacitor CE1, the first light emission control transistor TE1 is also turned off. Accordingly, the first light emission control signal may be maintained at the low level by the first emission control line E1 which is in a floating state.

At the time point t4, the first light emission control clock signal is changed to the low level, the light emission control start signal is maintained at the high level, and the second light emission control clock signal is maintained at the high level.

Before the time point t4, the fifth light emission control transistor TE5 is already turned on by the capacitor CE2, and at the time point t4, the fifth node N5 may be boosted to a level lower than the low level by the first light emission control clock signal changed to the low level. Accordingly, driving characteristics of the eighth light emission control transistor TE8 is improved, and the eighth light emission control transistor TE8 is turned on. The ninth light emission control transistor TE9 is turned on by the first light emission control clock signal. Accordingly, the second node N2 is connected to the high voltage line VGH to maintain the turned-off state. In embodiments, since the first light emission control clock signal of the low level is applied to the first node N1 through the light emission control transistors TE5 and TE4, the first light emission control transistor TE1 is turned on. Thus, the first light emission control line E1 is connected to the high voltage line VGH, and first light emission control signal becomes the high level.

In embodiments, since the third node N3 is connected to the fifth node N5 through the sixth light emission control transistor TE6, the influence of boosting for the third node N3 may be restricted unlike the fifth node N5. Accordingly, since a voltage difference between one electrode of the tenth light emission control transistor TE10 and another electrode thereof is minimized, it is possible to prevent the driving characteristics of the tenth light emission control transistor TE10 from being changed.

At the time point t5, the light emission control start signal is changed to the low level, the second light emission control clock signal is changed to the low level, and the first light emission control clock signal is maintained at the high level.

Accordingly, since the light emitting transistors TE12, TE7, TE2 are turned on and the low voltage line VGL is connected to the first light emission control line E1, the first light emission control signal of the low level is outputted.

Figure 7:
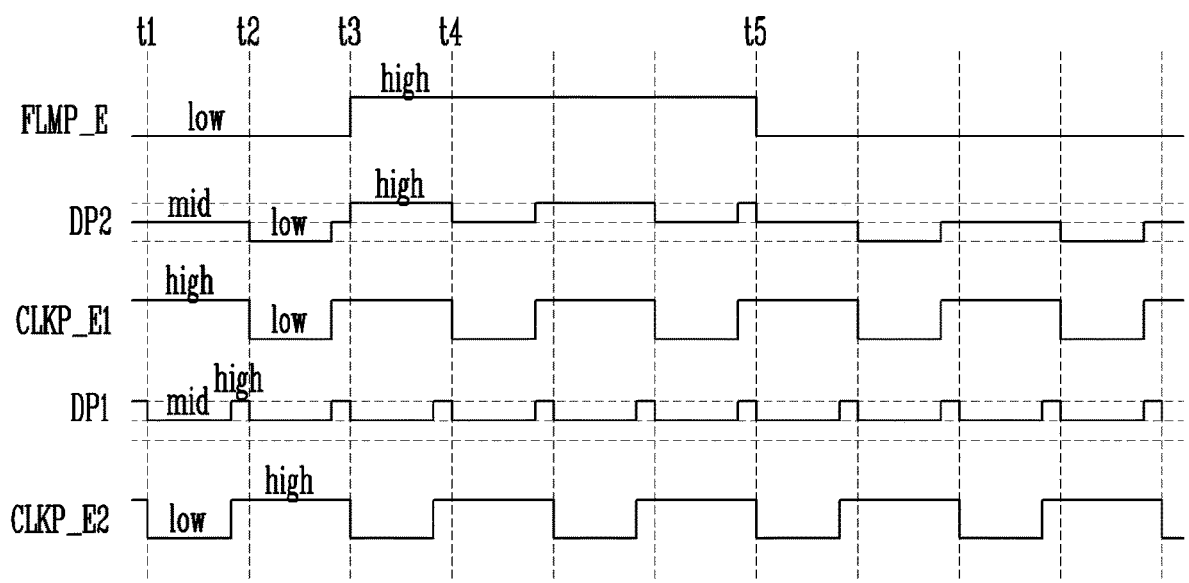
FIG. 7 illustrates a timing chart of voltage levels of pads related to a first light emission control driver according to an embodiment.

FIG. 7 illustrates a timing chart of voltage levels of pads related to a first light emission control driver.

The control pad FLMP_E is connected to the light emission control start line FLM_E, which is a corresponding control line (see FIG. 3). Accordingly, the voltage levels of the control pad FLMP_E at the time points t1 to t5 are the same as the voltage levels of the light emission control start line FLM_E of FIG. 6.

The control pad CLKP_E1 is connected to the first light emission control clock line CLK_E1, which is a corresponding control line (see FIG. 3). Accordingly, the voltage levels of the control pad CLKP_E1 at the time points t1 to t5 are the same as the voltage levels of the first light emission control clock line CLK_E1 of FIG. 6.

The control pad CLKP_E2 is connected to the second light emission control clock line CLK_E2, which is a corresponding control line (see FIG. 3). Accordingly, the voltage levels of the control pad CLKP_E2 at the time points t1 to t5 are the same as the voltage levels of the second light emission control clock line CLK_E2 of FIG. 6.

The dummy pad DP1 is positioned between the control pad CLKP_E2 and the control pad CLKP_E1, and a dummy signal may be applied to the dummy pad DP1. A voltage level of the dummy signal may correspond/equal to one of a voltage level between the second light emission control clock signal and the first light emission control clock signal, a voltage level of the second light emission control clock signal, and a voltage level of the first light emission control clock signal.

According to the embodiment, the voltage level of the dummy signal of the dummy pad DP1 may be an average of the voltage level of the second light emission control clock signal and the voltage level of the first light emission control clock signal at a certain time and/or at each time point.

In addition, according to the embodiment, when at least one of the voltage level of the second light emission control clock signal and voltage level of the first light emission control clock signal is changed, the voltage level of the dummy signal of the dummy pad DP1 may be changed.

For example, at the time point t1, since the second light emission control clock signal is the low level and the first light emission control clock signal is the high level, the dummy signal of the dummy pad DP1 may be a middle level which corresponds/equals to an average of the low level and the high level.

Immediately before the time point t2, since the voltage level of the second light emission control clock signal is changed, the voltage level of the dummy signal of the dummy pad DP1 may be changed. In embodiments, the dummy signal of the dummy pad DP1 may be a high level corresponding/equal to an average of the second light emission control clock signal of the high level and the first light emission control clock signal of the high level.

At the time point t2, since the voltage level of the first light emission control clock signal is changed, the voltage level of the dummy signal of the dummy pad DP1 may be changed. In embodiments, the dummy signal of the dummy pad DP1 may be a middle level corresponding to an average of the second light emission control clock signal of the high level and the first light emission control clock signal of the low level.

At time points later, similar patterns/relations will be repeated. The electromagnetic interference of the signals applied to the adjacent pads CLKP_E2 and CLKP_E1 may be reduced because of the dummy signal of the average level applied to the dummy pad DP1.

Without the dummy pad DP1, as the voltage level difference between the signals applied to the adjacent pads CLKP_E2 and CLKP_E1 increases, the migration of metal particles (e.g., copper particles) present in the anisotropic conductive film may increase. When the migration continues, the adjacent pads CLKP_E2 and CLKP_E1 may be undesirably short-circuited. The dummy signal applied to the dummy pad DP1 may reduce the voltage level difference between the signals applied to the adjacent pads CLKP_E2 and CLKP_E1, thereby preventing the undesirable short circuit.

The above description may be analogously applied to the control pads FLMP_E and CLKP_E1, and the dummy pad DP2 positioned between the control pads FLMP_E and CLKP_E1.

FIG. 8 illustrates a schematic diagram for explaining a first scan driver according to an embodiment.

Referring to FIG. 8, the first scan driver 41 according to the embodiment may include scanning stages (STS0, STS1, . . . ).

The scanning stages (STS0, STS1, . . . ) may be configured in a form of a shift register, which outputs a current scanning signal of a current scanning stage based on a previous scanning signal outputted from a previous scanning stage. However, since the first scanning stage STS0 cannot receive a previous scanning signal, it can be driven by receiving a scanning start signal.

The scanning stages (STS0, STS1, . . . ) may be connected to the first scanning clock line CLK_S1, the second scanning clock line CLK_S2, the high voltage line VGH, and the low voltage line VGL, respectively. The first scanning line CLK_S1 and the second scanning line CLK_S2 may be sequentially alternately connected to the scanning stages (STS0, STS1, . . . ). The scanning stages (STS0, STS1, . . . ) may be selectively connected to the high voltage line VGH or the scanning lines (S0, S1, . . . ) corresponding to the scanning clock lines CLK_S1 and CLK_S2.

Since internal configurations of the scanning stages (STS0, STS1, . . . ) are substantially the same, the scanning stage STS0 will be described as an example.

The scanning stage STS0 may include scanning transistors TS1, TS2, TS3, TS4, TS5, TS6, TS7, and TS8 and capacitors CS1 and CS2.

One electrode of the first scanning transistor TS1 may be connected to the high voltage line VGH, the other electrode thereof may be connected to the scanning line S0, and a gate electrode thereof may be connected to the other electrode of the capacitor CS1.

One electrode of the second scanning transistor TS2 may be connected to the scanning line S0, the other electrode thereof may be connected to the first scanning clock line CLK_S1, and a gate electrode thereof may be connected to the other electrode of the capacitor CS2.

One electrode of the third scanning transistor TS3 may be connected to the gate electrode of the first scanning transistor TS1, the other electrode thereof may be connected to the second scanning clock line CLK_S2, and a gate electrode thereof may be connected to one electrode of the eighth scanning transistor TS8.

One electrode of the fourth scanning transistor TS4 may be connected to the gate electrode of the second scanning transistor TS2, the other electrode thereof may be connected to one electrode of the eighth scanning transistor TS8, and a gate electrode thereof may be connected to the low voltage line VGL.

One electrode of the fifth scanning transistor TS5 may be connected to the gate electrode of the first scanning transistor TS1, the other electrode thereof may be connected to the low voltage line VGL, and a gate electrode thereof may be connected to the first scanning clock line CLK_S1.

One electrode of the sixth scanning transistor TS6 may be connected to the high voltage line VGH, the other electrode thereof may be connected to one electrode of the seventh scanning transistor TS7, and a gate electrode thereof may be connected to the gate electrode of the first scanning transistor TS1.

One electrode of the seventh scanning transistor TS7 may be connected to the other electrode of the sixth scanning transistor TS6, the other electrode thereof may be connected to one electrode of the eighth scanning transistor TS8, and a gate electrode thereof may be connected to the first scanning clock line CLK_S1.

One electrode of the eighth scanning transistor TS8 may be connected to the other electrode of the fourth scanning transistor TS4, the other electrode thereof may be connected to the scanning start line FLM_S, and a gate electrode thereof may be connected to the second scanning clock line CLK_S2.

One electrode of the capacitor CS1 may be connected to the high voltage line VGH, and the other electrode thereof may be connected to the gate electrode of the first scanning transistor TS1.

One electrode of the capacitor CS2 may be connected to the scanning line S0, and the other electrode thereof may be connected to the gate electrode of the second scanning transistor TS2.

Figure 9:
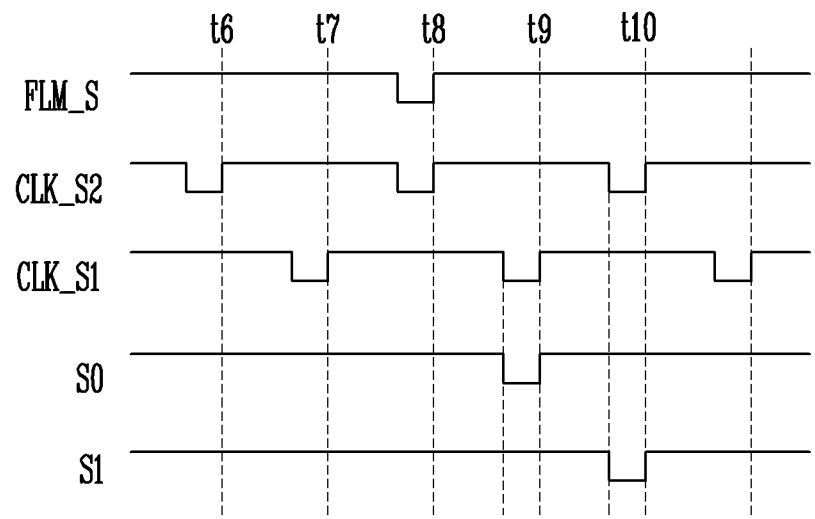
FIG. 9 illustrates a timing chart for explaining a driving method of a first scan driver according to an embodiment.

FIG. 9 illustrates a timing chart for explaining a driving method of a first scan driver.

A signal applied to the scanning start line FLM_S is referred to as a scanning start signal, a signal applied to the first scanning clock line CLK_S1 is referred to as a first scanning clock signal, a signal applied to the second scanning clock line CLK_S2 is referred to as a second scanning clock signal, a signal applied to the current scanning line S0 is referred to as a current scanning signal, and a signal applied to the next scanning line S1 is referred to as a next scanning signal. In FIG. 9, a voltage level of each signal is shown. In FIG. 9, the voltage level of each signal is described as one of a low level and a high level.

In FIG. 9, a horizontal interval between vertical dashed lines may mean one horizontal period. Each of the time points t6 to t10 of FIG. 9 has no continuity with each of the time points t1 to t5 of FIG. 7.

Since the scanning start signal of the high level is periodically applied to the other electrode of the capacitor CS2 while the scanning start signal is maintained at the high level, the capacitor CS2 is maintained at a voltage corresponding to a turn-off level of the second scanning transistor TS2. Accordingly, a falling pulse of the second scanning clock signal generated adjacent to the time point t6, and a falling pulse of the first scanning clock signal generated adjacent to the time point t7 do not affect the voltage levels of the scanning signals.

Adjacent to the time point t8, the falling pulse is generated in each of the scanning start signal and the second scanning clock signal.

In embodiments, since the scanning start signal is the low level, the scanning transistors TS1, TS2, TS3, TS4, TS5, and TS6 are turned on, and the seventh scanning transistor TS7 is turned off. Accordingly, since the high voltages of the first scanning clock signal of high level and the high voltage line VGH are simultaneously applied to the current scanning line S0, the current scanning signal is maintained at the high level.

In embodiments, the capacitor CS2 is charged with a voltage capable of maintaining the second scanning capacitor TS2 in the turned-on state.

Adjacent to the time point t9, the falling pulse of the first scanning clock signal is generated.

In embodiments, since the second scanning transistor TS2 is maintained in the turned-on state by the capacitor CS2, the falling pulse of the first scanning clock signal is applied to the scanning line S0, and the current scanning signal has the falling pulse adjacent to the time point t9.

In embodiments, since the boosting voltage lower than the low level is applied to the gate electrode of the second scanning transistor TS2 by the capacitor CS2, the driving characteristics of the second scanning transistor TS2 may be improved.

In embodiments, the scanning transistors TS8, TS4, and TS2 of the next scanning stage STS1 are turned on, and the capacitor CS2 of the next scanning stage STS1 is charged with a voltage capable of maintaining the second scanning transistor TS2 of the next scanning stage STS1 in the turned-on state.

Since the falling pulse of the second scanning clock signal is generated adjacent to the time point t10 and the falling pulse of the second scanning clock signal is applied to the next scanning line S1 by the second scanning transistor TS2 maintained in the turned-on state in the next scanning stage STS1, the next scanning signal has the falling pulse adjacent to the time point t10.

Figure 10:
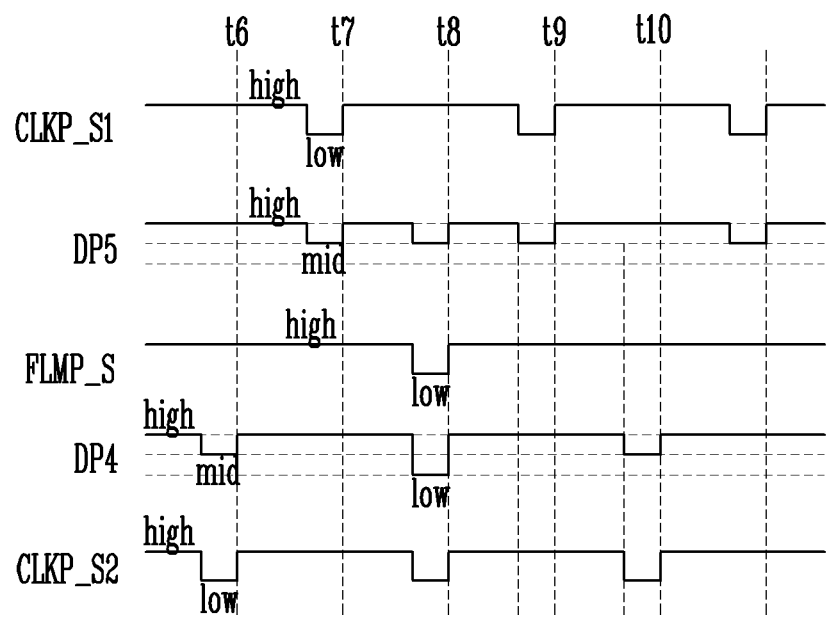
FIG. 10 illustrates a timing chart of voltage levels of pads related to a first scan driver according to an embodiment.

FIG. 10 illustrates a timing chart of voltage levels of pads related to a first scan driver.

The control pad FLMP_S is connected to the scanning start line FLM_S, which is a corresponding control line (see FIG. 3). Accordingly, the voltage levels of the control pad FLMP_S at the time points t6 to t10 are the same as the voltage levels of the scanning start line FLM_S of FIG. 9.

The control pad CLKP_S1 is connected to the first scanning clock line CLK_S1, which is a corresponding control line (see FIG. 3). Accordingly, the voltage levels of the control pad CLKP_S1 at the time points t6 to t10 are the same as the voltage levels of the first scanning clock line CLK_S1 of FIG. 9.

The control pad CLKP_S2 is connected to the second scanning clock line CLK_S2, which is a corresponding control line (see FIG. 3). Accordingly, the voltage levels of the control pad CLKP_S2 at the time points t6 to t10 are the same as the voltage levels of the second light emission control clock line CLK_S2 of FIG. 9.

The dummy pad DP4 is positioned between the control pad CLKP_S2 and the control pad FLMP_S, and a dummy signal may be applied to the dummy pad DP4. A voltage level of the dummy signal may correspond/equal to one of a voltage level between the second scanning clock signal and the scanning start signal, a voltage level of the second scanning clock signal, and a voltage level of the scanning start signal.

According to the embodiment, the voltage level of the dummy signal of the dummy pad DP4 may be an average of the voltage level of the second scanning clock signal and the voltage level of the scanning start signal at a certain time and/or at each time point.

In the embodiment, when at least one of the voltage level of the second scanning clock signal and the voltage level the scanning start signal is changed, the voltage level of the dummy signal of the dummy pad DP4 may be changed.

For example, immediately before the time point t6, since the second scanning clock signal is the low level and the scanning start signal is the high level, the dummy signal of the dummy pad DP4 may be a middle level which corresponds to an average of the low level and the high level.

At the time point t6, since the voltage level of the second scanning clock signal is changed, the voltage level of the dummy signal of the dummy pad DP4 may be changed. In embodiments, the dummy signal of the dummy pad DP4 may be a high level corresponding to an average of the second scanning clock signal of the high level and the scanning start signal of the high level.

At time points later, similar patterns/relations will be repeated. The electromagnetic interference of the signals applied to the adjacent pads CLKP_S2 and FLMP_S may be reduced because of the dummy signal of the average level applied to the dummy pad DP4.

Without the dummy pad DP4, as the voltage level difference between the signals applied to the adjacent pads CLKP_S2 and FLMP_S increases, the migration of metal particles present in the anisotropic conductive film may increase. When the migration continues, the adjacent pads CLKP_S2 and FLMP_S may be undesirably short-circuited. The dummy signal applied to the dummy pad DP4 may reduce the voltage level difference between the signals applied to the adjacent pads CLKP_S2 and FLMP_S, thereby preventing the short-circuit problem.

The above description may be analogously applied to the control pads LMP_S and CLKP_S1, and the dummy pad DP5 positioned between the control pads LMP_S and CLKP_S1.

The above description may be analogously applied to the control pads FLMP_E and CLKP_S2a, and the dummy pad DP3 positioned between the control pads FLMP_E and CLKP_S2a (see FIG. 3).

Figure 11:
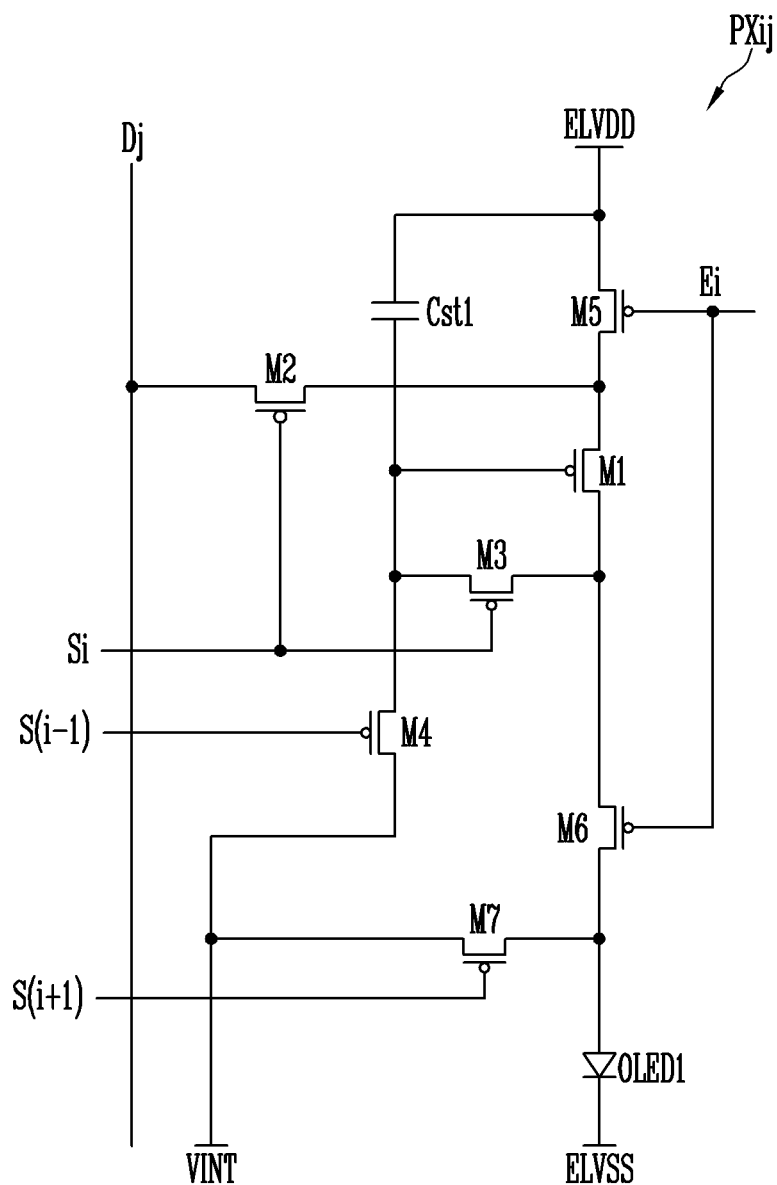
FIG. 11 illustrates a schematic diagram (e.g., a circuit diagram) for explaining a pixel according to an embodiment.

FIG. 11 illustrates a schematic diagram for explaining a pixel according to an embodiment.

Referring to FIG. 11, the pixel PXij includes transistors M1, M2, M3, M4, M5, M6, and M7, a storage capacitor Cst1, and an organic light emitting diode OLED1.

One electrode of the storage capacitor Cst1 may be connected to the first power source voltage line ELVDD, and the other electrode thereof may be connected to a gate electrode of the transistor M1.

One electrode of the transistor M1 may be connected to the other electrode of the transistor M5, and the other electrode thereof may be connected to one electrode of the transistor M6, and a gate electrode thereof may be connected to the other electrode of the storage capacitor Cst1. The transistor M1 may be referred to as a driving transistor. The transistor M1 determines an amount of a driving current flowing between the first power source voltage line ELVDD and the second power source voltage line ELVSS according to a potential difference between the gate electrode and the source electrode.

One electrode of the transistor M2 may be connected to a data line Dj, the other electrode thereof may be connected to one electrode of the transistor M1, and a gate electrode thereof may be connected to a current scanning line Si. The transistor M2 may be referred to as a switching transistor. The transistor M2 inputs a data voltage of the data line Dj to the pixel PXij when a scanning signal of a turn-on level is applied to the current scanning line Si.

One electrode of the transistor M3 is connected to the other electrode of the transistor M1, the other electrode thereof is connected to the gate electrode of the transistor M1, and a gate electrode thereof is connected to the current scanning line Si. The transistor M3 allows the transistor M1 to be diode-connected when the scanning signal of the turn-on level is applied to the current scanning line Si.

One electrode of the transistor M4 is connected to the gate electrode of the transistor M1, the other electrode thereof is connected to the initialization voltage line VINT, and a gate electrode thereof is connected to a previous scanning line S(i−1). In some embodiments, the gate electrode of the transistor M4 may be connected to another scanning line. When the turn-on level of the scanning signal is applied to the previous scanning line S(i−1), the transistor M4 transmits an initialization voltage VINT to the gate electrode of the transistor M1 to initialize an amount of charges of the gate electrode of the transistor M1.

One electrode of the transistor M5 is connected to the first power source voltage line ELVDD, the other electrode thereof is connected to one electrode of the transistor M1, and a gate electrode thereof is connected to a light emission control line Ei. One electrode of the transistor M6 is connected to the other electrode of the transistor M1, the other electrode thereof is connected to an anode of the organic light emitting diode OELD1, and a gate electrode thereof is connected to the light emission control line Ei. When the light emission control signal of the turn-on level is applied to the transistors M5 and M6, the transistors M5 and M6 form a driving current path between the first power source voltage line ELVDD and the second power source voltage line ELVSS to operate the organic light emitting diode OELD1 to emit light.

One electrode of the transistor M7 is connected to the anode of the organic light emitting diode OLED1, the other electrode thereof is connected to the initialization voltage line VINT, and a gate electrode thereof is connected to a next scanning line S(i+1). In some embodiments, the gate electrode of the transistor M7 may be connected to another scanning line. When the scanning signal of the turn-on level is applied to the next scanning line S(i+1), the transistor M7 transmits the initialization voltage VINT to the anode of the organic light emitting diode OLED1 to initialize an amount of charges charged in the organic light emitting diode OELD1.

The anode of the organic light emitting diode OLED1 is connected to the other electrode of the transistor M6, and the cathode thereof is connected to the second power source voltage line ELVSS.

Figure 12:
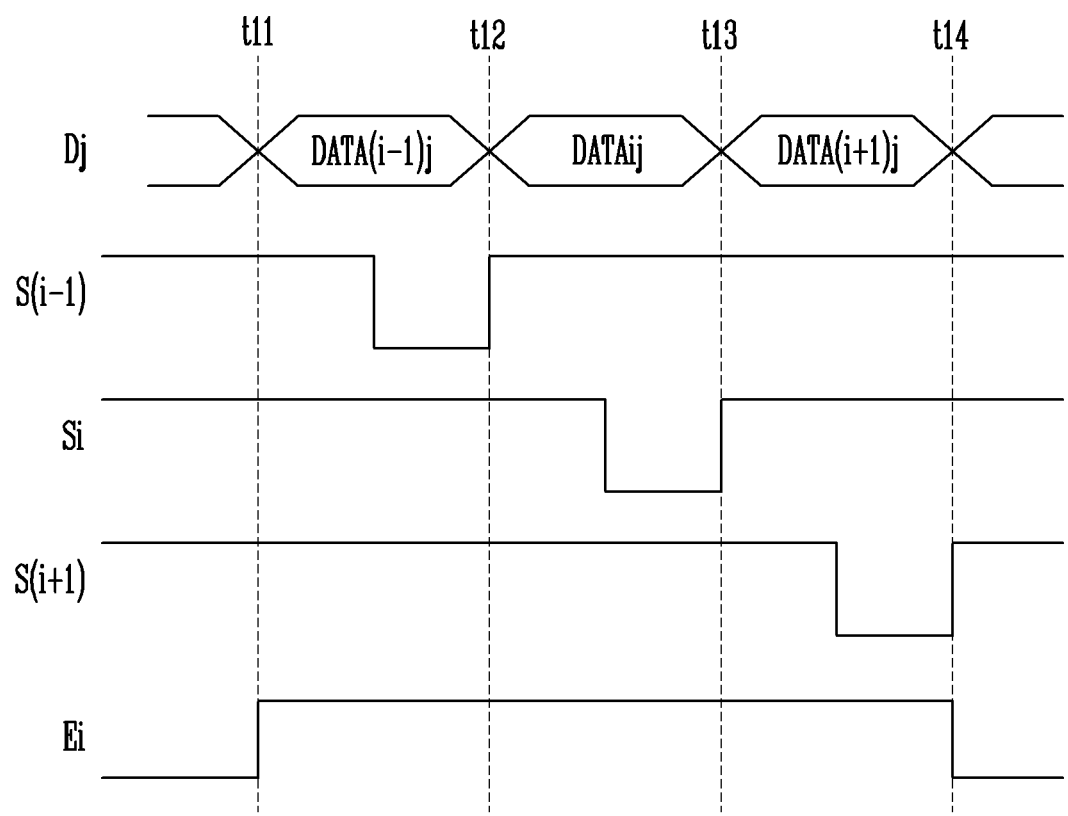
FIG. 12 illustrates a timing chart for explaining a driving method of a pixel according to an embodiment.

FIG. 12 illustrates a timing chart for explaining a driving method of a pixel according to an embodiment.

Each of the time points t11 to t14 of FIG. 12 has no continuity with each of the time points t1 to t10 of FIG. 6 and FIG. 9. In FIG. 12, a horizontal interval between vertical dashed lines may mean one horizontal period.

During the period of t11 to t12, a data voltage DATA(i−1)j for a previous pixel column is applied to the data line Dj, and the scanning signal of the turn-on level (low level) is applied to the previous scanning line S(i−1).

Since the scanning signal of the turned-off level (high level) is applied to the current scanning line Si, the transistor M2 is turned off, the data voltage for the previous pixel column DATA(i−1)j is prevented from being inputted to the pixel PXij.

In embodiments, since the transistor M4 is turned on, the initialization voltage is applied to the gate electrode of the transistor M1 to initialize charges. Since the light emission control signal of the turn-off level is applied to the light emission control line Ei, the transistors M5 and M6 are turned off, and while the initialization voltage VINT is applied, unnecessary light emission of the organic light emitting diode OLED1 is prevented.

During the period of t12 to t13, a data voltage DATAij for a current pixel column is applied to the data line Dj, and the scanning signal of the turn-on level is applied to the current scanning line Si. Accordingly, the transistors M2, M1, and M3 are turned on, and the data line Dj and the gate electrode of the transistor M1 are electrically connected. Accordingly, the data voltage DATAij is applied to the other electrode of the storage capacitor Cst1, the storage capacitor Cst1 is charged with an amount of charges corresponding to a difference between the voltage of the first driving voltage line ELVDD and the data voltage DATAij.

During the period of t13 to t14, the data voltage DATA(i+1)j for the next pixel column is applied to the data line Dj, and the scanning signal of the turn-on level is applied to the next scanning line Si. Accordingly, since the transistor M7 is turned on, the initialization voltage VINT is applied to the anode of the organic light emitting diode OLED1, and the organic light emitting diode OELD1 is pre-charged with an amount of charges corresponding to a voltage difference between the initialization voltage and the second driving voltage line ELVSS or is initialized.

After the time point t14, the transistors M5 and M6 are turned on as the light emission control signal of the turn-on level is applied to the light emission control line Ei, and an amount of a driving current passing through the transistor M1 is controlled according to an amount of charges stored in the storage capacitor Cst1, thus a driving current flows to the organic light emitting diode OLED1. The organic light emitting diode OLED1 emits light until the light emission control signal of the turn-off level is applied to the light emission control line Ei.

Figure 13:
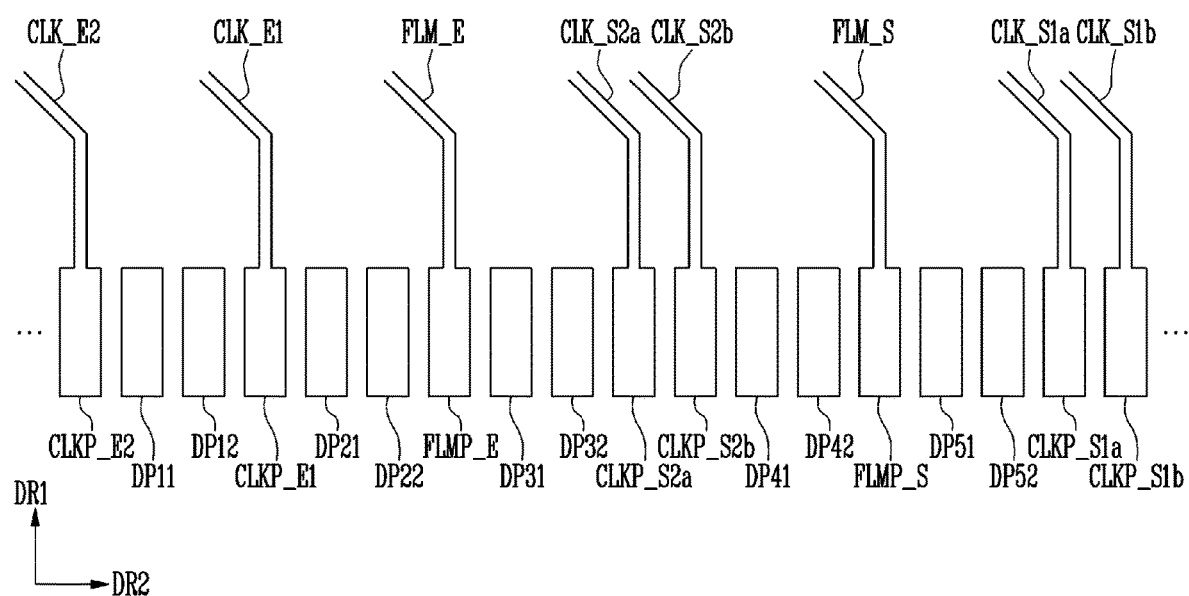
FIG. 13 illustrates a schematic diagram (e.g., a plan view) for explaining pads according to an embodiment.

FIG. 13 illustrates a schematic diagram for explaining pads according to another embodiment.

The control pads CLKP_E2, CLKP_E1, FLMP_E, CLKP_S2a, CLKP_S2b, FLMP_S, CLKP_S1a, and CLKP_S1b, which are connected to control lines CLK_E2, CLK_E1, FLM_E, CLK_S2a, CLK_S2b, FLM_S, CLK_S1a, and CLK_S1b, may be positioned in an area IA'. Dummy pads DP11, DP12, DP21, DP22, DP31, DP32, DP41, DP42, DP51, and DP52 may also be positioned in the area IA'.

The first control pad P1, the second control pad P2, and the first dummy pad DP of FIG. 2 may each represent one or more pads illustrated in FIG. 13. The dummy pad DP11 may be positioned between the control pad CLKP_E2 and the control pad CLKP_E1. The dummy pad DP21 may be positioned between the control pad CLKP_E1 and the control pad FLMP_E. The dummy pad DP31 may be positioned between the control pad FLMP_E and the control pad CLKP_S2a. The dummy pad DP41 may be positioned between the control pad CLKP_S2b and the control pad FLMP_S. The dummy pad DP51 may be positioned between the control pad FLMP_S and the control pad CLKP_S1a.

In the embodiment of FIG. 13, the dummy pad DP12 may be further positioned between the dummy pad DP11 and the control pad CLKP_E1. The dummy pad DP22 may be positioned between the dummy pad DP21 and the control pad FLMP_E. The dummy pad DP32 may be positioned between the dummy pad DP31 and the control pad CLKP_S2a. The dummy pad DP42 may be positioned between the dummy pad DP41 and the control pad FLMP_S. The dummy pad DP52 may be positioned between the dummy pad DP51 and the control pad CLKP_S1a.

Figure 14:
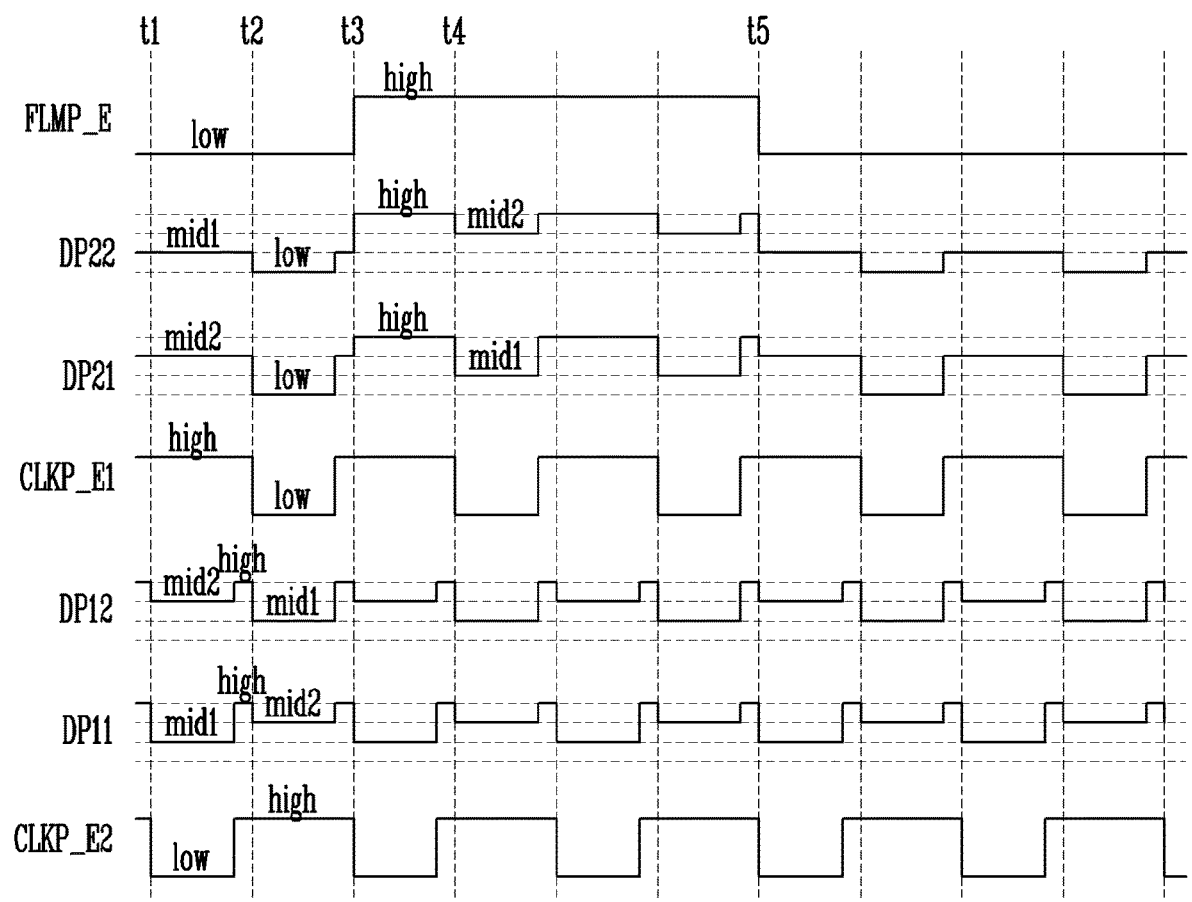
FIG. 14 illustrates a timing chart of voltage levels of pads related to a first light emission control driver among pads of FIG. 13 according to an embodiment.
Figure 15:
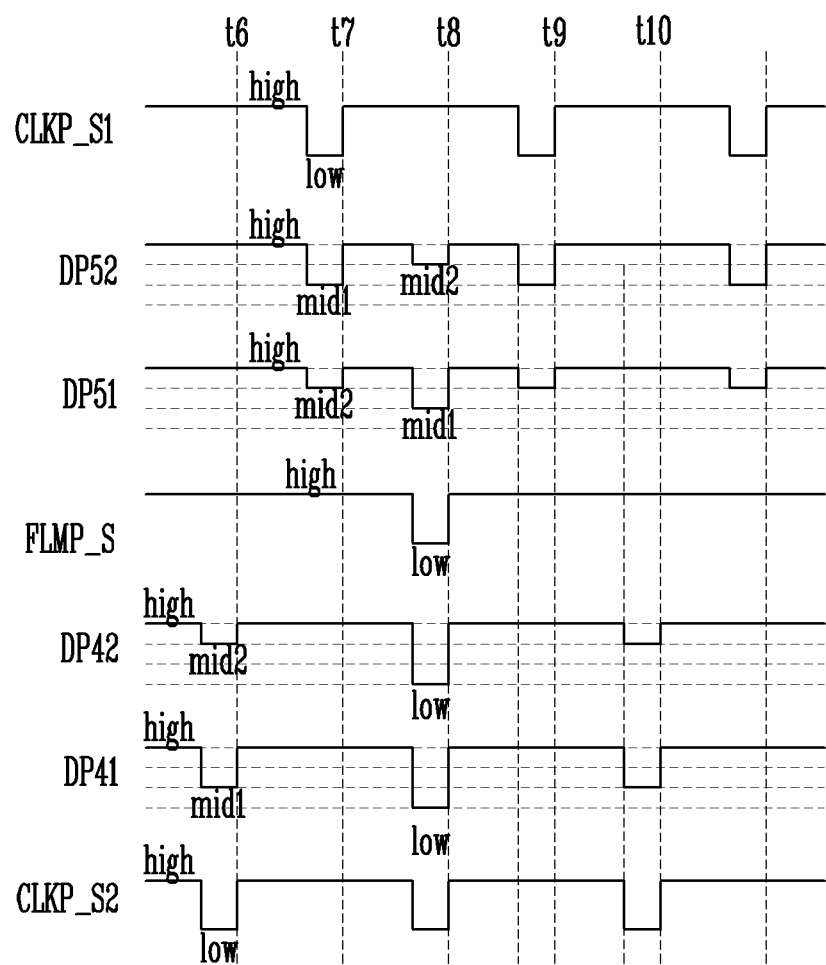
FIG. 15 illustrates a timing chart of voltage levels of pads related to a first scan driver among pads of FIG. 13 according to an embodiment.

FIG. 14 illustrates a timing chart of voltage levels of pads related to a first light emission control driver among pads of FIG. 13, and FIG. 15 illustrates a timing chart of voltage levels of pads related to a first scan driver among pads of FIG. 13.

The dummy pad DP12 is positioned between the dummy pad DP11 and the control pad CLKP_E1, and a second dummy signal may be applied to the dummy pad DP12. A voltage level of the second dummy signal may correspond/equal to one of a voltage level between the second light emission control clock signal and the first light emission control clock signal, a voltage level of the second light emission control clock signal, and a voltage level of the first light emission control clock signal.

According to the embodiment, when the second light emission control clock signal and the voltage level of the first light emission control clock signal are the same, the first dummy signal of the dummy pad DP11 and the second dummy signal of the dummy pad DP12 may have the same voltage level. For example, immediately before the time point t2, when the second light emission control clock signal and the voltage level of the first light emission control clock signal have the same high level, it can be seen that the first dummy signal of the dummy pad DP11 and the second dummy signal of the dummy pad DP12 have the same voltage level of the high level.

According to the embodiment, when the voltage level of the second light emission control clock signal is greater than the voltage level of the first light emission control clock signal, the voltage level of the first dummy signal of the dummy pad DP11 may be greater than the voltage level of the second dummy signal of the dummy pad DP12. For example, at the time point t2, the voltage level of the second light emission control clock signal is maintained at the high level, and the first light emission control clock signal is changed to the low level, and in embodiments, the first dummy signal of the dummy pad DP11 may be a second middle level mid2, and the second dummy signal of the dummy pad DP12 may be a first middle level mid1. The second middle level mid2 is higher than the first middle level mid1.

According to the embodiment, when the voltage level of the first light emission control clock signal is greater than the voltage level of the second light emission control clock signal, the voltage level of the second dummy signal of the dummy pad DP12 may be greater than that of the first dummy signal of the dummy pad DP11. For example, at the time point t3, the second light emission control clock signal is changed to the low level, and the first light emission control clock signal is maintained at the high level, and in embodiments, the second dummy signal of the dummy pad DP12 may be the second middle level, and the first dummy signal of the dummy pad DP11 may be the first middle level.

When the dummy pad DP12 is included in addition to the dummy pad DP11, by differently configuring the dummy signals between the adjacent dummy pads DP11 and DP12, it is possible to further reduce electromagnetic interference between signals applied to adjacent control pads CLKP_E2 and CLKP_E1. In embodiments, the problem of metal particle migration described above may be prevented or minimized.

The above description may be analogously applied to other pads of FIG. 13.

Figure 16:
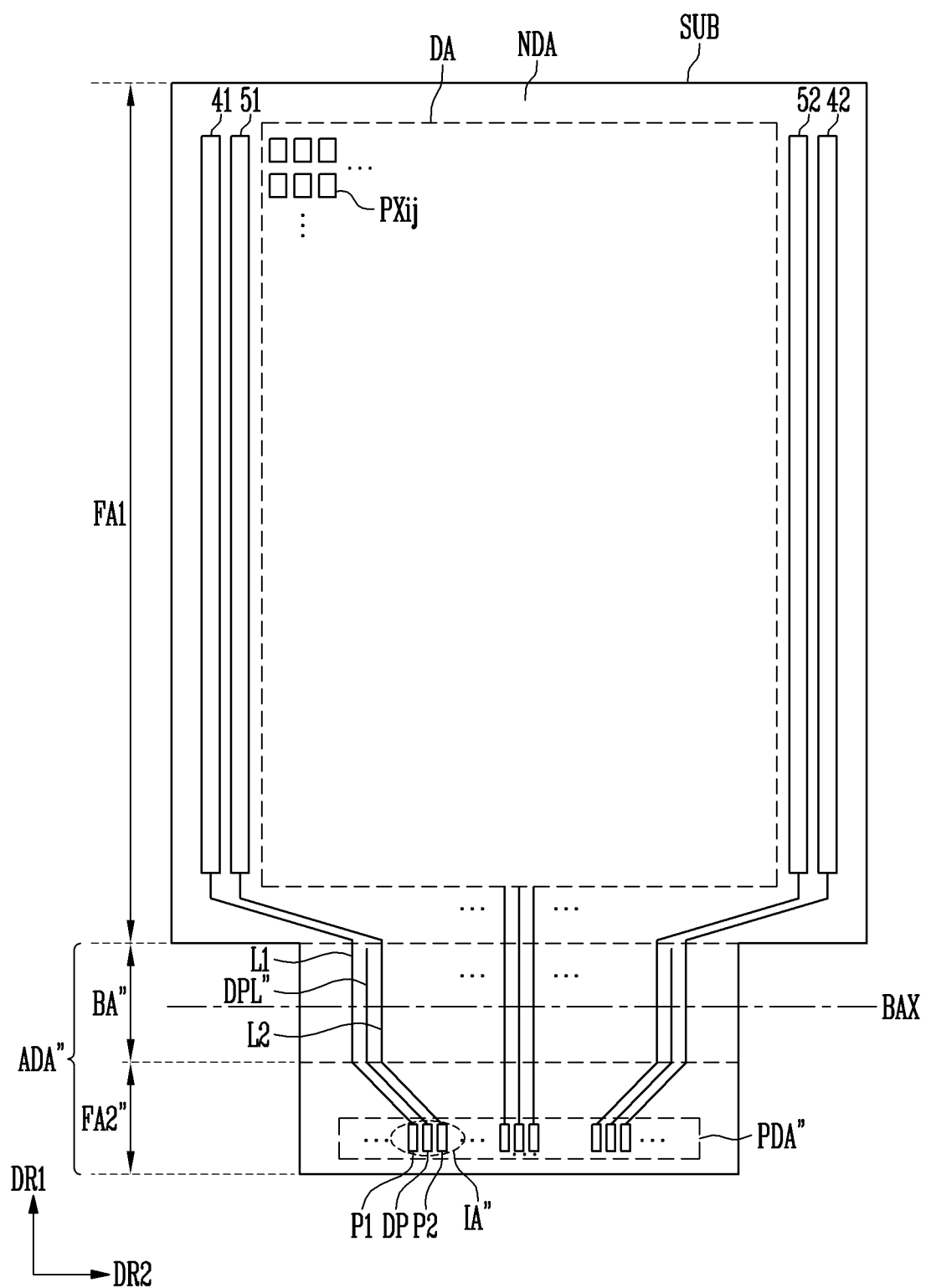
FIG. 16 illustrates a schematic diagram (e.g., a plan view) for explaining a display device according to an embodiment.

FIG. 16 illustrates a schematic diagram for explaining a display device according to another embodiment.

Compared with the display device 9 of FIG. 2, the display device 9" further includes a first dummy line DPL".

The first dummy line DPL" may be connected to the first dummy pad DP, and it may be positioned between the first control line L1 and the second control line L2 and may be shorter than each of the control lines L1 and L2.

Unlike the first control line L1 and the second control line L2, the first dummy line DPL" may not be electrically connected to either one of the first scan driver 41 and the first light emission control driver 51.

For example, the first control line L1 and the second control line L2 may extend over a pad area PDA", the wire area, the non-display area NDA. In embodiments, the first dummy line DPL" may extend over the pad area PDA" and the wire area, but it may not be positioned in the non-display area NDA.

The first control line L1 and the second control line L2 need to secure a minimum separation distance in the wire area in order to sufficiently avoid electromagnetic interference between their signals. When the first dummy line DPL" according to the present embodiment is further included in the display device 9", it is possible to reduce the separation distance, thereby improving space utilization.

In some embodiments, a second dummy pad may be further included between the second control pad P2 and the first dummy pad DP. In addition, a second dummy line extending from the second dummy pad may be further included. Features and advantages of the second dummy pad and the second dummy line may be appreciated from FIG. 13 to FIG. 16 and related description.

FIG. 17 illustrates a schematic diagram for explaining pads according to the embodiment of FIG. 16.

FIG. 17 is an enlarged view of an area IA" of FIG. 16.

The control pads CLKP_E2, CLKP_E1, FLMP_E, CLKP_S2a, CLKP_S2b, FLMP_S, CLKP_S1a, and CLKP_S1b, which are connected to the control lines CLK_E2, CLK_E1, FLM_E, CLK_S2a, CLK_S2b, FLM_S, CLK_S1a, and CLK_S1b, may be positioned in the area IA".

Dummy pads DP1, DP2, DP3, DP4, and DP5 and dummy lines DP1", DPL2", DPL3", DPL4", and DPL5" extending from the dummy pads DP1, DP2, DP3, DP4, and DP5 may be further included in the area IA".

The accompanying drawings and the detailed description are illustrative. Those skilled in the art will understand that various modifications and other equivalent embodiments are possible. The scope of practical embodiments is defined by the appended claims.

What is claimed is:

1. A display device, comprising:
   a pixel for emitting light with luminance corresponding to a data signal, wherein the pixel is controlled by a first control signal and a second control signal;
   a first control line for transmitting the first control signal;
   a second control line for transmitting the second control signal;
   a first control pad electrically connected to the first control line for supplying the first control signal to the first control line;
   a second control pad electrically connected to the second control line for supplying the second control signal to the second control line;
   a first dummy pad that is positioned between the first control pad and the second control pad and configured to receive a first dummy signal; and
   a second dummy pad that is positioned between the first dummy pad and the second control pad and configured to receive a second dummy signal, wherein a voltage level of the second dummy signal is in the range from the voltage level of the first control signal of the first control pad to the voltage level of the second control signal of the second control pad,
   wherein a voltage level of the first dummy signal and a voltage level of the second dummy signal are in a range from a voltage level of the first control signal of the first control pad to a voltage level of the second control signal of the second control pad, and
   wherein the first dummy signal and the second dummy signal have different voltage levels when the first control signal and the second control signal have different voltage levels.

2. The display device of claim 1, wherein
   when the first control signal and the second control signal have the same voltage level, the first dummy signal and the second dummy signal have the same voltage level.

3. The display device of claim 2, wherein
   when the voltage level of the first control signal is greater than the voltage level of the second control signal, the voltage level of the first dummy signal is greater than the voltage level of the second dummy signal.

4. The display device of claim 3, wherein
   when the voltage level of the second control signal is greater than the voltage level of the first control signal, the voltage level of the second dummy signal is greater than the voltage level of the first dummy signal.

5. The display device of claim 1, further comprising:
   a scan driver for supplying a scanning signal that determines whether to input the data signal to the pixel,
   wherein the first control line is electrically connected to the scan driver.

6. The display device of claim 5, wherein
   the second control line is electrically connected to the scan driver.

7. The display device of claim 5, further comprising:
   a light emission control driver for supplying a light emission control signal that determines a light emitting starting point and a light emitting finishing point of the pixel,
   wherein the second control line is electrically connected to the light emission control driver.

8. A method of operating a display device, the method comprising:
   providing a first control signal and a second control signal for controlling supply of a data signal to a pixel of the display device, wherein the pixel is configured to emit light with luminance corresponding to the data signal, wherein the first control signal is provided to a first control pad of the display device and transmitted through a first control line of the display device, and wherein the second control signal is provided to a second control pad of the display device and transmitted through a second control line of the display device;
   providing a first dummy signal to a first dummy pad, wherein the first dummy pad is positioned between the first control pad and the second control pad; and
   providing a second dummy signal to a second dummy pad, wherein the second dummy pad is positioned between the first dummy pad and the second control pad,
   wherein a voltage level of the first dummy signal and a voltage level of the second dummy signal are in a range from a voltage level of the first control signal of the first control pad to a voltage level of the second control signal of the second control pad, and
   wherein the first dummy signal and the second dummy signal have different voltage levels when the first control signal and the second control signal have different voltage levels.

* * * * *